United States Patent [19]

Sung

[11] Patent Number: 5,174,857

[45] Date of Patent: Dec. 29, 1992

[54] SLOPE ETCHING PROCESS

[75] Inventor: Kang H. Sung, Seoul, Rep. of Korea

[73] Assignee: Gold Star Co., Ltd., Seoul, Rep. of Korea

[21] Appl. No.: 783,123

[22] Filed: Oct. 28, 1991

[30] Foreign Application Priority Data

Oct. 29, 1990 [KR] Rep. of Korea ............... 17368/1990
Dec. 3, 1990 [KR] Rep. of Korea ............... 19768/1990
Mar. 21, 1991 [KR] Rep. of Korea ................ 4456/1991

[51] Int. Cl.⁵ ..................... H01L 21/306; B44C 1/22; C03C 15/00; C23F 1/00
[52] U.S. Cl. .................................. 156/643; 156/656; 156/657; 156/659.1; 156/662; 156/626; 156/904
[58] Field of Search ............... 156/643, 644, 646, 653, 156/656, 657, 659.1, 662, 904, 626; 204/192.32, 192.35, 192.37; 252/79.5; 430/313, 317, 318

[56] References Cited

U.S. PATENT DOCUMENTS

| | | | |
|---|---|---|---|
| 4,409,319 | 10/1983 | Colacino et al. | 156/644 X |
| 4,671,849 | 6/1987 | Chen et al. | 156/643 |
| 4,698,128 | 10/1987 | Berglund et al. | 156/659.1 X |
| 4,705,597 | 11/1987 | Gimpelson et al. | 156/659.1 X |
| 4,892,613 | 1/1990 | Motai et al. | 156/651 |

Primary Examiner—William A. Powell
Attorney, Agent, or Firm—Fish & Richardson

[57] ABSTRACT

A slope etching process comprising the steps of coating a photoresist on a layer of hard material, baking the photoresist under a predetermined condition so that it flows down to have at its opposite side edges respective slant surface of a desired slope angle and then dry etching simultaneously the photoresist and the hard material layer so as to provide the hard material layer at its opposite side edges with a desired slope angle. In accordance with this process, the step coverage is improved, and thus the rate of poor products and the generation of noise are reduced.

4 Claims, 12 Drawing Sheets

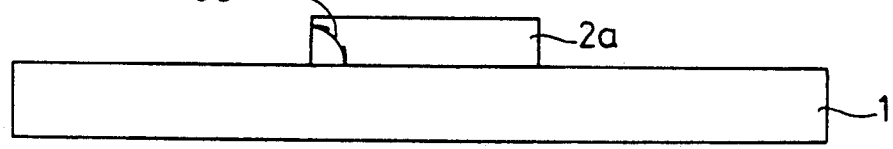
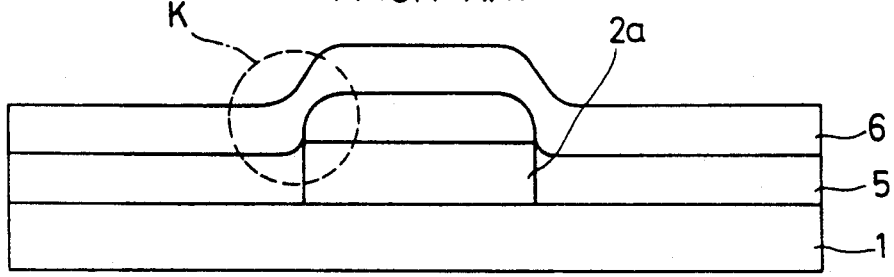
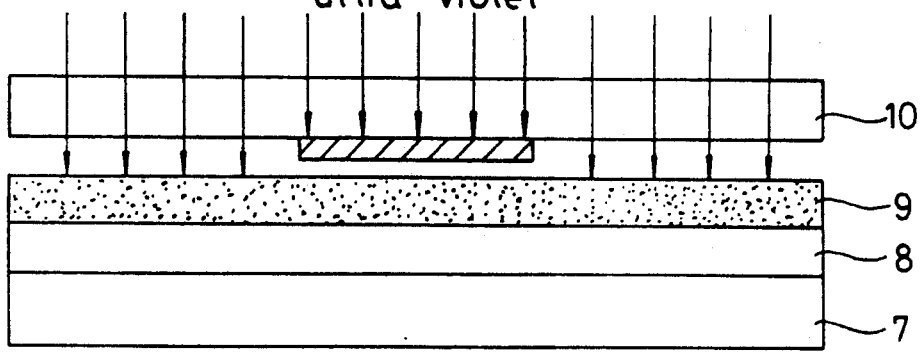

SLOPE ETCHING PROCESS

BACKGROUND OF THE INVENTION

1. Field of the Invention

The present invention relates to a process for etching hard materials, and particularly to a process for slope etching both ends of a hard material.

2. Description of the Prior Art

Such process for slope etching hard materials has been utilized in various technical fields, and recently applied to semiconductor devices, for the purpose of improving step coverage.

In order to form a desired pattern of a hard material layer in manufacturing semiconductor elements, photo processing and etching should be generally carried out. The etching is mainly classified into a dry etching process and a wet etching process, a suitable one of which is used depending on the existing conditions.

Recently, RIE (Reactive Ion Etching) method which is generally classified as the dry etching method is gradually and widely used in virtue of its convenience in processing, over the wet etching method using liquid chemicals.

The conventional process for forming a pattern of a hard material by utilizing the above-mentioned RIE method will now be described, in conjunction with FIGS. 1A to 1D.

First, a layer 2 for forming a predetermined pattern is deposited on a substrate 1, as shown in FIG. 1A. On the layer 2, a photoresist 3 is coated and then radiated with ultra violet under the condition that a photomask 4 provided with a predetermined pattern is aligned on the photoresist 3 to be in contact therewith. As a result, the photoresist 3 is partially removed, in order to form a photoresist pattern layer 3a having the predetermined pattern, as shown in FIG. 1B.

Thereafter, the pattern forming layer 2 for forming a desired pattern is subjected to an etch utilizing the RIE method which is an anisotropy dry etch method. After the photoresist pattern layer 3a is removed from the etched pattern forming layer 2, a pattern layer 2a having the corner angle of 90° is formed, as shown in FIG. 1D.

However, this pattern forming process utilizing the conventional RIE method has a disadvantage that when a primary upper deposition layer 5 is coated on the pattern layer 2a etched according to the RIE method, the step coverage, that is the coverage of the deposition layer 5 over steps (the "K" portion in FIG. 2) formed at respective corners of about 90° of the pattern layer 2a becomes poor, after the process integration. Consequently, the pattern layer 2a formed by the RIE method and a second upper deposition layer 6 formed on the primary upper deposition layer 5 are subject to a short failure, thereby causing the productivity of semi-conductor elements to be reduced.

Also, the process for forming a pattern of a hard material by utilizing the conventional wet etching method will now be described, in conjunction with FIGS. 3A to 3D.

First, a pattern forming layer 8 to be etched is deposited on a substrate 7, as shown in FIG. 3A. On the layer 8, a photoresist 9 is coated. Then, the photoresist 9 is exposed to ultra violet by using a photomask 10 printed with a predetermined pattern, and thereby developed to form a photoresist pattern layer 9a as shown in FIG. 3B. Thereafter, wet etching is carried out as shown in FIG. 3C. At this time, the pattern forming layer 8 is isotropically etched. This is because the velocity $V_S$ of the etching which proceeds on the interface between the photoresist 10 and the pattern forming layer 8 and in parallel to said interface is substantially identical to the velocity $V_D$ of the etching which proceeds in vertical to the surface of the element material. As a result, a pattern layer 8a is formed such that its lateral edges forms an angle of 45° to the surface of substrate 7. As the photoresist pattern layer 9a is removed, the desired pattern layer 8a is formed, as shown in FIG. 3D.

However, this pattern forming process utilizing the conventional wet etching method also has a disadvantage that when a primary upper deposition layer 11 is coated on the pattern layer 8a etched according to the wet etching method, its step coverage over respective 45° lateral edges of the pattern layer 8a becomes poor, as shown in FIG. 4. Consequently, the pattern layer 8a and a second upper deposition layer 12 formed on the primary upper deposition layer 11 are subject to a short failure at the portion "L" in FIG. 4. In particular, when the pattern layer 8a and the second upper deposition layer 12 form metal electrodes and the primary upper deposition layer forms an insulation layer, the pattern layer 8a and the second upper deposition layer 12 may be subject to a short or a break down at the portion "L", thereby causing the productivity of semi-conductor elements to be reduced.

Referring to FIG. 5, there is shown an example of conventional constructions of contact type image sensors. In the drawing, the reference numeral "13" designates a glass substrate, "14" a lower electrode, "14a" a gate electrode, "15", "15a" and "15b" insulation layers, that is $Si_xN_y$ layers, "16" an amorphous silicon layer, "17" an upper electrode, "17a" a source electrode, "17b" a drain electrode, "18" an insulation layer, that is an ITO (indium thin oxide) layer, "19" a photodiode zone which is the zone receiving light corresponding to image, and "20" a thin film transistor (TFT) zone which is the zone transmitting signals.

In this case, the amorphous silicon layer 16 in the photodiode zone 19 has the thickness of about 8,000 Å to about 1 μm. The ITO layer 18 has the thickness of about 2,000 Å, while the lower electrode 14 has the thickness of about 2,000 Å. Accordingly, the total thickness of the photodiode zone 19 is relatively as thick as about 1.2 μm to about 1.4 μm.

In the case of performing the RIE process by using a dry etching equipment, therefore, both sides of the photodiode zone 19, and particularly both sides of its amorphous silicon layer 16 form sharp vertical surfaces being at an angle of about 90° to a horizontal plane. Since the amorphous silicon layer 16 has at its both sides sharp vertical surfaces, the ITO layer 18 and the upper electrode 17 coated on the amorphous silicon layer 16 has a thinner thickness at the zones m and n corresponding to the corner edges of the amorphous silicon layer 16, as compared to other zones. As a result, the step coverage of the ITO layer 18 and the upper electrode 17 over lateral edges of the amorphous silicon layer 16 becomes poor, thereby increasing the rate of poor products. Furthermore, the products tend to be weak against noise and damaged by a relatively low level of impact. Consequently, the overall performance of contact type image sensors is decreased.

In FIG. 5, the thin film transistor 20 which forms the signal transmitting zone comprises the glass substrate 13, the gate electrode 14a formed on the glass substrate 13, a low concentration amorphous silicon layer 16a and a high concentration amorphous silicon layer 16b which are formed as channel layers on the gate electrode 14a, and the source electrode 17a and the drain electrode 17b formed on the channel layers, respectively.

In similar to the photodiode zone 19, the low concentration amorphous silicon layer 16a and the high concentration amorphous silicon layer 16b functioning as channel layers have at their side edges step surfaces forming an angle of about 90° to the horizontal plane, respectively, since they are anisotropically formed according to a dry etching method. As a result, the subsequently formed source and drain electrodes 17a and 17b have a step shape, so that the insulation layer 15a coated on the source and drain electrodes 17a and 17b has a thinner thickness at its both side edges than other areas. That is, the step coverage of the insulation layer 15a becomes poor, thereby causing the same problems as in the case of the photodiode zone 19.

When the gate electrode 14a of the thin film transistor 20 is anisotropically formed according to a dry etching method, it has at its side edges step surfaces forming an angle of about 90° to the horizontal plane, as in the cases of the source and drain electrodes 17a and 17b and the photodiode zone 19. Accordingly, the step coverage of the subsequently coated layer on the gate electrode 14a becomes poor, so that the layer may be subject to a short failure, thereby causing the productivity of semi-conductor elements to be reduced.

In order to overcome the above-mentioned problems, various methods for slope etching a hard material layer have been proposed.

For example, a contact etching process of a method for manufacturing semi-conductor devices will now be described, in conjunction with FIGS. 6A to 6C.

First, an oxide layer 22 is formed on a substrate 21, as shown in FIG. 6A. Then, unnecessary part of the oxide layer 22 to be removed is defined by a photoresist 23 disposed on the oxide layer 22. The defined unnecessary part of oxide layer 22 is primarily wet etched by using a chemical solution, as shown in FIG. 6B. At this time, the photoresist 23 functions as a mask. Thereafter, the defined unnecessary part of oxide layer 22 is secondarily wet etched again, by using the photoresist 23 as a mask, as shown in FIG. 6C. According to this double etching, the oxide layer 22 has slant surfaces at its portions corresponding to respective opposite edges of formed contact. In this case, the slope angle of each edge of the contact can be adjusted by controlling the etch selectivity rate of the oxide layer 22 and the photoresist 23 upon wet or dry etching.

However, even when the etching is carried out under the condition of controlling the etch selectivity rate between the oxide layer 22 and the photoresist 23, it is difficult to smoothly slope each side surface of oxide layer 22 at a desired angle throughout the length thereof, because the slope of each corresponding surface of the photoresist 23 is vertical.

Otherwise, slope etching may be accomplished only by using the wet etching process, so far as the etch selectivity rate is properly controlled. In this case, however, the process is complex and requires expensive chemical etching solutions. Furthermore, the use of such chemical solutions results in increasing the possibility of the formation of glass layers at the boundary surfaces of the etched material.

Recently, the wet etching process has been commonly used, due to the above-mentioned problems.

SUMMARY OF THE INVENTION

Therefore, an object of the present invention is to overcome the above-mentioned disadvantages encountered in the prior arts and to provide a slope etching process capable of slope etching opposite sides of a hard material layer coated on another hard material layer so as to improve the step coverage of the coated layer.

In accordance with the present invention, this object is accomplished by providing a slope etching process comprising the steps of: coating a photoresist on a layer of hard material; defining said hard material layer by treating said photoresist according to a photo lithography process; baking the photoresist under a predetermined condition so that it flows down to have at its opposite side edges respective slant surface of a desired slope angle and thereby provide the hard material layer at its opposite side edges with a desired slope angle; and then dry etching simultaneously the photoresist and the hard material layer under a predetermined atmosphere.

BRIEF DESCRIPTION OF THE DRAWINGS

Numerous other feature, objects and advantages of the invention will become apparent from the following specification when read in connection with the accompanying drawings in which:

FIGS. 1A to 1D are schematic sectional views illustrating a conventional dry etching method;

FIG. 2 is a schematic sectional view explaining a disadvantage encountered in the conventional dry etching method;

FIGS. 3A to 3D are schematic sectional views illustrating a conventional wet etching method;

DETAILED DESCRIPTION OF THE PREFERRED EMBODIMENTS

The present invention will now be described in detail, in conjunction with its four embodiments shown in FIGS. 7 to 10.

FIRST EMBODIMENT

Figure 1A:
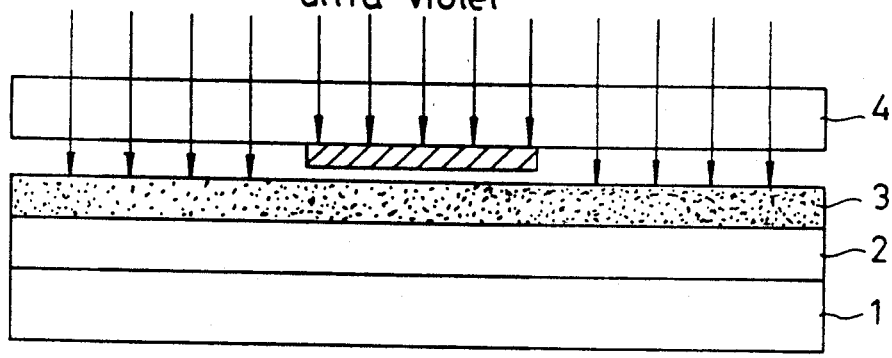
Figure 1B:
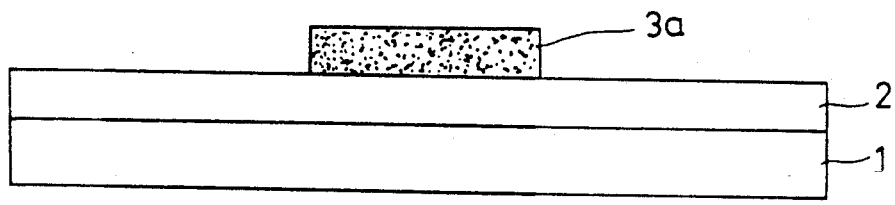
Figure 1C:
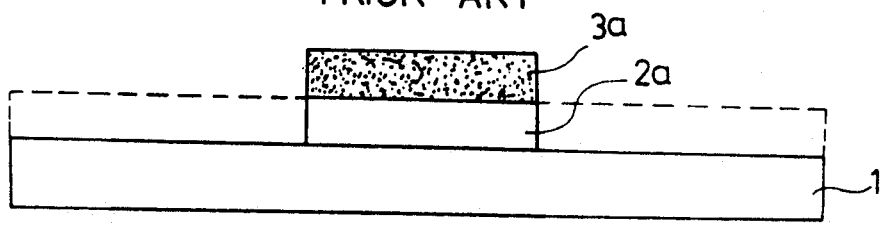
Figure 3B:
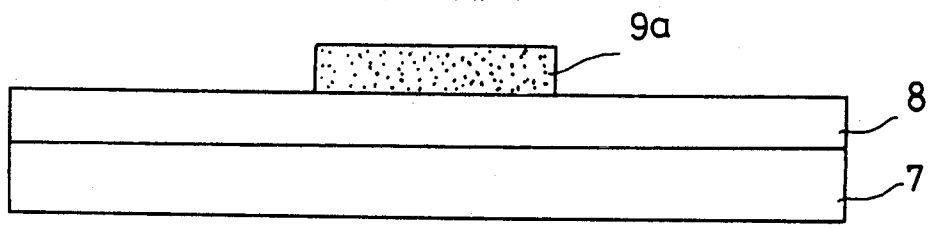
Figure 3C:
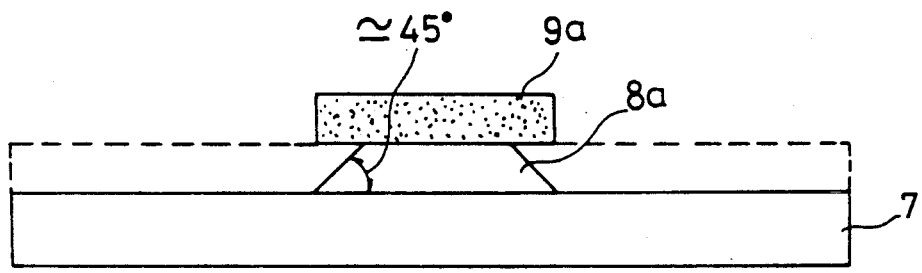
Figure 3D:
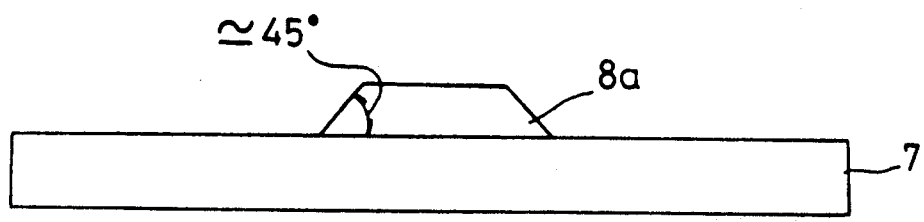
Figure 4:
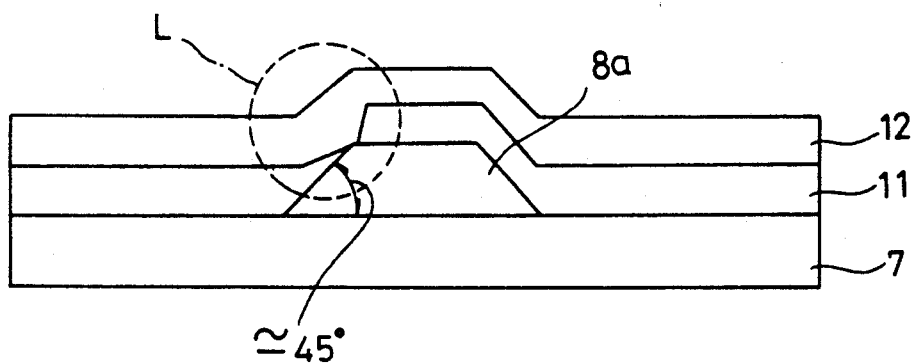
FIG. 4 is a schematic sectional view explaining a disadvantage encountered in the conventional wet etching method.
Figure 5:
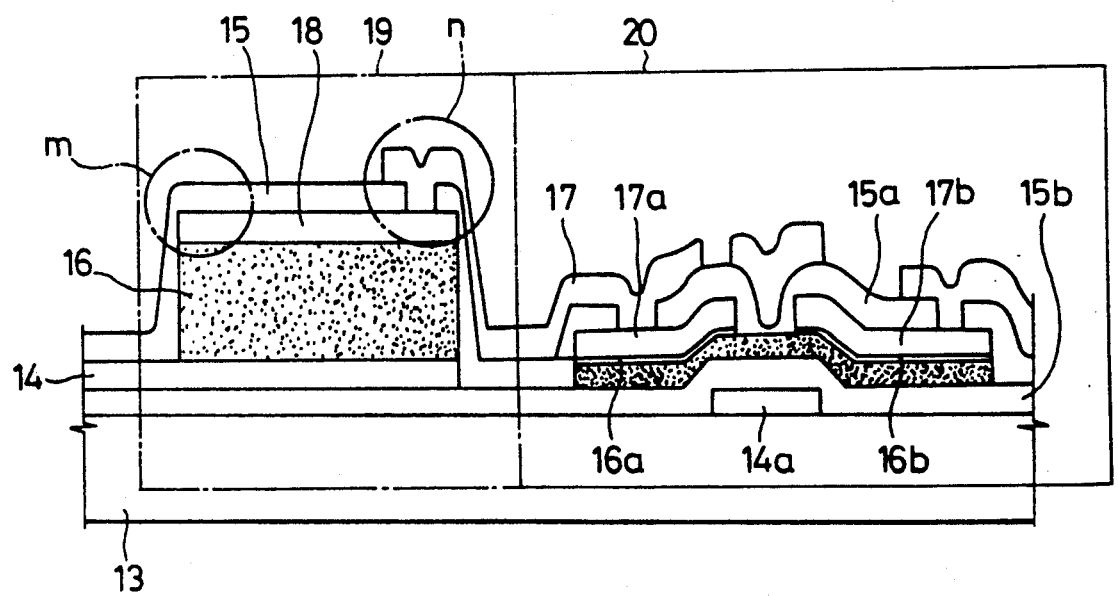
FIG. 5 is a schematic sectional views illustrating the construction of a conventional contact type image sensor.
Figure 6A:
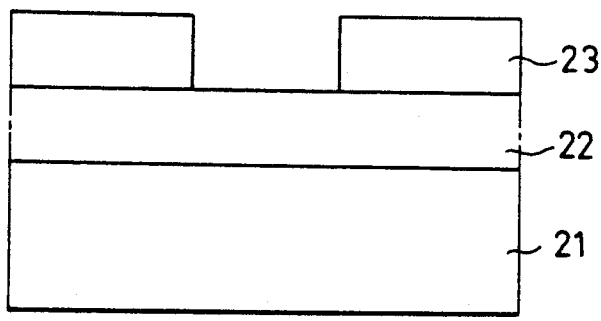
FIGS. 6A to 6C are schematic sectional views illustrating a slope etching process wherein a conventional wet etching and a conventional dry etching are combined.
Figure 6B:
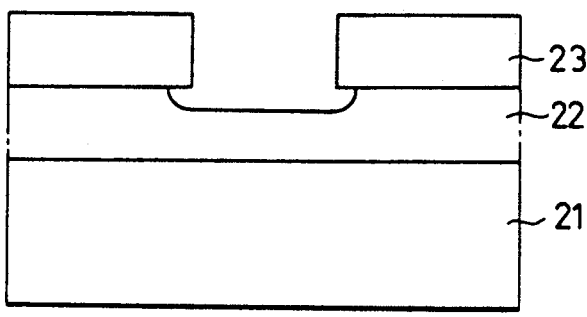
Figure 6C:
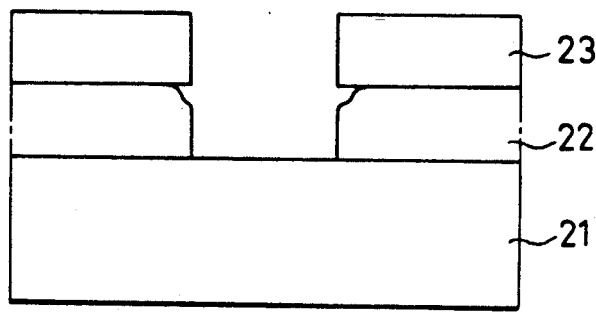

Referring to FIGS. 7A to 7E, there is shown a process for forming the gate electrode 14a of the thin film transistor 20 illustrated in FIG. 5.

Figure 7A:
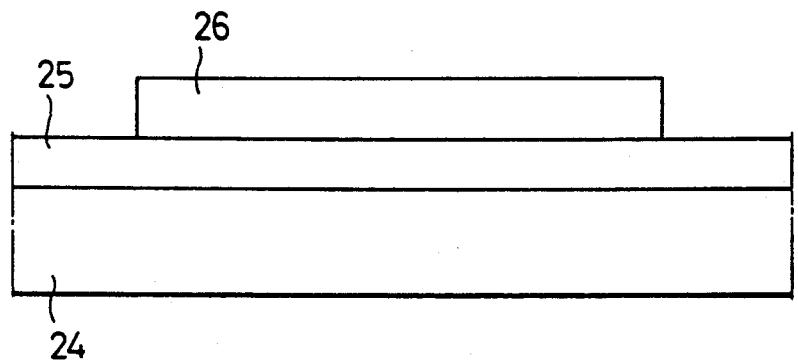
FIGS. 7A to 7E are schematic sectional views illustrating the formation of a thin film transistor of a contact type image sensor in accordance with the present invention.
Figure 7B:
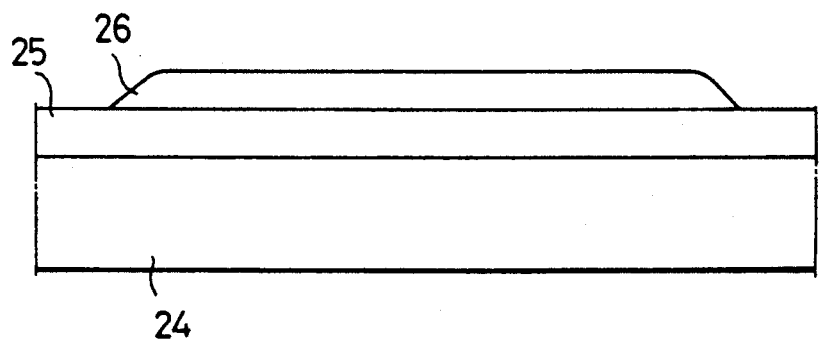

First, a chromium layer 25 is deposited on a glass substrate 24. A photoresist 26 is coated on the chromium layer 25, in order to form a pattern for the gate electrode and then subject to a pre-baking at about 90° C. and for about 20 minutes, in order to volatilize solvent components therefrom. Thereafter, the photoresist 26 is subject to a selective exposure, so as to define the chromium layer 25. For its transformation as shown in FIG. 7B, the photoresist 26 is subject to a post baking at about 130° C. to 150° C. for 30 minutes to 50 minutes. According to the post baking, the photoresist 26 flows to be transformed as desired.

Figure 7C:
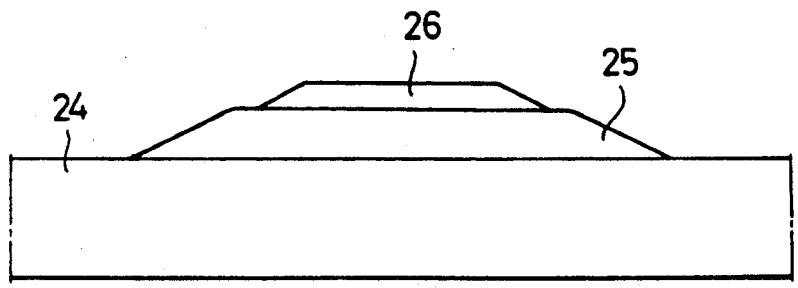
Figure 7D:
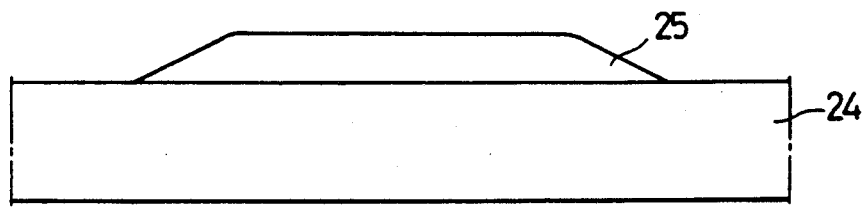
Figure 7E:
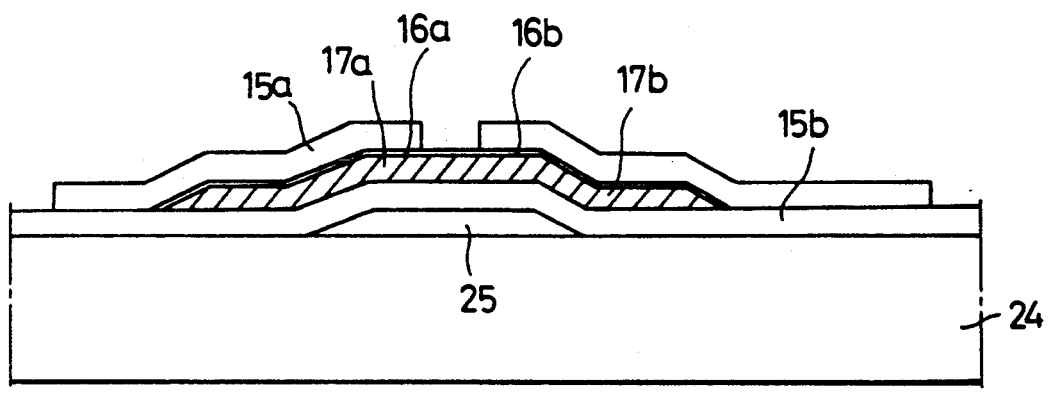

As shown in FIG. 7C, the chromium layer 25 and the photoresist 26 are then simultaneously dry etched. Thereafter the remainder of photoresist 26 is removed, as shown in FIG. 7D. At this time, the etching process is performed under the condition that oxygen is added to the using etching gas. The etching extent is varied, depending upon the thickness of the photoresist 26. That is, the etching occurs initially at the region where the photoresist 26 is not coated. The thin part of the photoresist 26 is then gradually and slowly etched. As a result, the etching of gate electrode is initiated at the region where the photoresist 26 is not coated, so that the gate electrode is slopingly etched, there by forming a thin film transistor shaped as shown in FIG. 7E.

According to the baking extent, the pre-baking and the post baking are called a soft baking and a hard baking, respectively. These baking processes are performed under the condition of the pressure of 100 mTorr in a pressure chamber, the flow rate of the etching gas $CCl_4$ of 30 to 50 SCCM, the flow rate of oxygen of 5 to 10 SCCM and the power density of high frequency signal of 0.3 to 10 watt/$cm^2$.

Now, the post baking process for the photoresist 26 will be described in detail.

The post baking is the process for heating the photoresist 26 to a higher temperature after the completion of the development process which is the final photo process. This post etching is performed before the dry etching. The purpose of this post etching is to remove the residual solvent as in the pre-baking process, improve the adhesion of the photoresist 26 to the chromium layer 25 and increase the etch resistance of the photoresist 26 in the dry etching thereof. In addition, the flowing of photoresist 26 occurs according to the post baking, so that the generation of thin spots or pin holes in the photoresist 26 is reduced. This flowing of photoresist 26 is initially generated when the post baking temperature reaches the temperature corresponding to the softening point of photoresist which is known as the glass transition temperature.

Although the residual solvent remaining after pre-baking or soft-baking is about 3% to about 4% of the total solvent, this amount is considerably reduced in the case of post baking or hard baking.

Such additional process for removing residual solvent from the photoresist is important in the case that patterned wafers are processed in an ion implanter and a dry etcher and under the vacuum environment where the residual solvent on the surface of photoresist 26 undesirably causes a solvent-burst effect on the photoresist 26.

The adhesion of the photoresist 26 to the chromium layer 25 is improved, by virtue of the post baking process. However, a carefulness is necessary, because the adhesion rather may become poor at excessive temperature. For example, it is preferred that when the photoresist 26 is not coated on the chromium layer, but coated on an oxide layer, the post baking temperature is about 170° C. to about 180° C. Of course, this case is irrespective of this embodiment of the present invention. If the post baking temperature exceeds the temperature range of about 170° C. to about 180° C., the bond between the photoresist and the oxide layer is collapsed, thereby causing the adhesion to be sharply decreased.

Accordingly, if the adhesion of the photoresist is a critical requirement, the post baking temperature should be determined to meet the using specific photoresist.

On the other hand, the adhesion of the photoresist 26 may be strengthened after the exposure in performing the photo process, but before the development and the post baking.

In order to improve the adhesion of the photoresist to materials such as an oxide layer containing ion at a high concentration or a polysilicon substrate, a secondary pre-baking or soft baking may be carried out at the temperature of about 90° C. and for about 5 minutes to about 10 minutes.

The post baking also improves the etch resistance of the photoresist film 26. Typically, the following technologies have been proposed for improving the etch resistance:

First, implanting ion of high dose in the surface of photoresist by using low energy beam;

Second, performing a plasma hardening; and

Third, performing an ultra violet hardening.

As the photoresist 26 is subject to a post baking in the above-mentioned manner, the edge profile of the photoresist 26 is transformed. However, when the post baking is carried out at the temperature higher than a predetermined temperature, the wall profile, namely the shape and size of the chromium layer 25 is unchanged.

By the post baking process, the photoresist 26 can have a profile that its opposite side ends are tapered. As an anisotropy dry etching process is subsequently performed, the patterned chromium layer 25 has a tapered wall profile. As a result, other layers subsequently deposited on the chromium layer 25 cover the chromium layer 25 with more uniform thickness.

As apparent from the above description, the adhesion of photoresist 26 is maximized by optimizing the cycle of the post baking process. As a result, a desired wall profile of the chromium layer 25 can be obtained, so that the residual photoresist 26 remaining after the dry etching can be easily removed. If the post baking temperature is higher than the predetermined temperature, the removal of residual photoresist 26 remaining after the dry etching is difficult.

SECOND EMBODIMENT

FIGS. 8A to 8E illustrates the formation of the photodiode zone 19 of the contact type image sensor shown in FIG. 5, in accordance with the present invention.

Figure 8A:
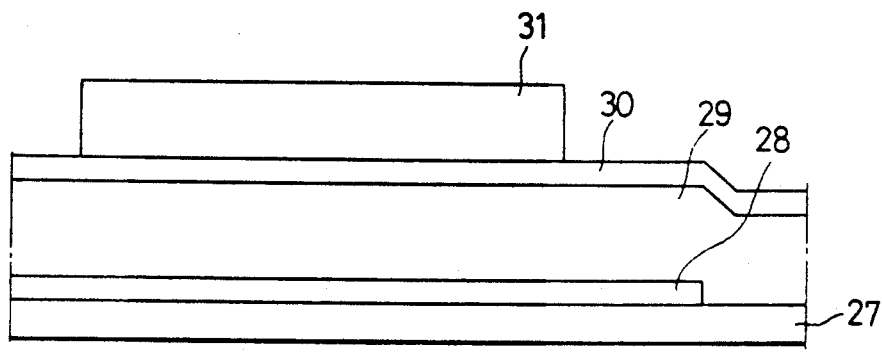
FIGS. 8A to 8E are schematic sectional views illustrating the formation of a photodiode zone of a contact type image sensor in accordance with the present invention.

First, a lower electrode 28 is coated on a glass substrate 27 to a certain thickness, as shown in FIG. 8A. On the lower electrode 28, an amorphous silicon layer 29 of a certain thickness and an ITO layer 30 of a certain thickness are in turn coated. A photoresist 31 of a certain thickness is then coated on the upper surface of ITO layer 30. Thereafter, a well-known photo process is performed for removing the unnecessary part of photoresist 31.

Figure 8B:
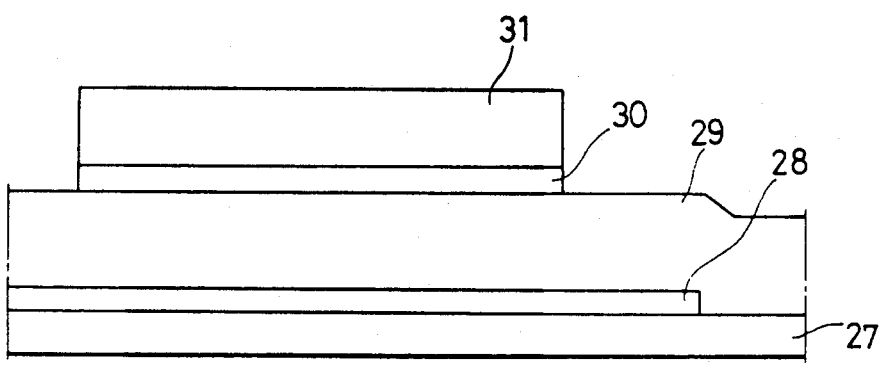
Figure 8C:
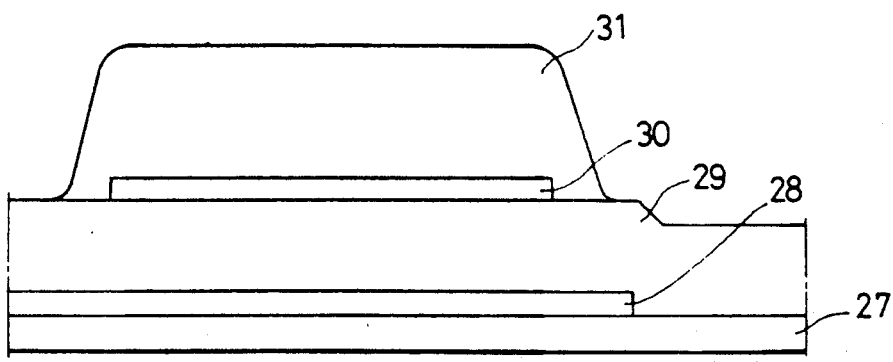
Figure 8D:
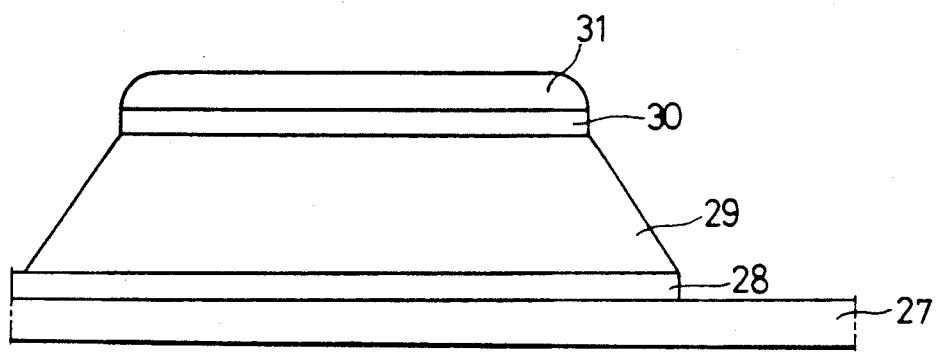

After the ITO layer 30 is subject to a patterning as shown in FIG. 8C, a baking for the photoresist 31 is carried out at the temperature of about 120° C. to 250° C. and for about 20 minutes to about 40 minutes so that the material of photoresist 31 flows slopingly down along and beyond opposite side edges of the ITO layer 30, as shown in FIG. 8C. Subsequently, a reactive ion etching, namely RIE is carried out so that the amorphous silicon layer 29 is provided at its opposite side edges with respective slant surfaces.

In the case other than the slope etching, etching gases such as $CCl_2F_2$, $CF_4$ and $CF_3Br$ are used for pure amorphous silicon. In the case of slope etching, the composition of etching gases is properly controlled. For example, the slope angle of the amorphous silicon layer 29 can be adjusted by performing the reactive ion etching by using the abovementioned etching gases containing oxygen gas in amount of no more than about 20%. The quantity of using etching gases is also varied, depending upon the thickness of amorphous silicon layer 29. When the oxygen content is no more than 20%, the slope angle is about 10° to about 40°.

On the other hand, DC bias voltage used in the reactive ion etching process is varied, depending on the kind of using etching gases for pure amorphous silicon. For example, DC, bias voltage of $-100$ V to $-200$ V is preferably used in the case of $CF_4$. In cases of $CCl_2F_2$ and $CF_3$, DC bias voltage of $-25$ V to $-60$ V is preferred.

Figure 8E:
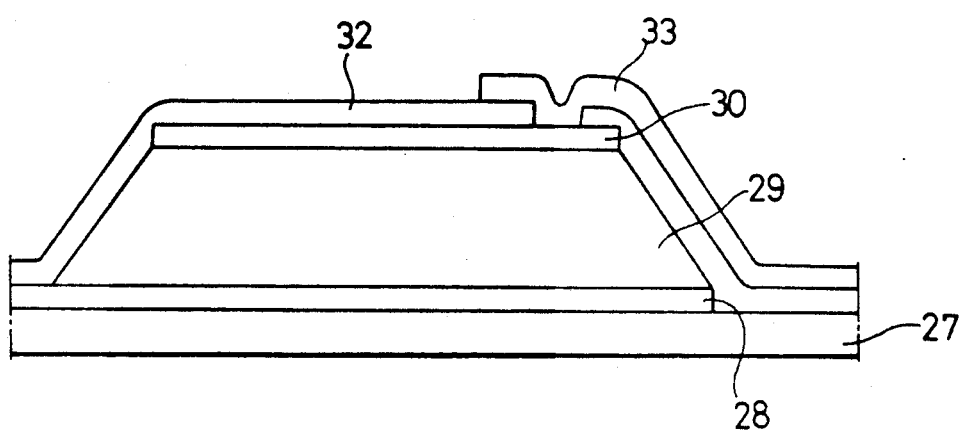

Thereafter, the photoresist 31 is removed from the ITO layer 30, as shown in FIG. 8E. On the ITO layer 30, an insulation layer 32 and an upper electrode 33 are in turn formed and then patterned. Thus, the photodiode zone 19 of the contact type image sensor is obtained.

As above-mentioned, the amorphous silicon layer 29 is provided at its opposite side edges with respective slant surfaces, thereby avoiding the insulation 32 and the upper electrode 33 from being damaged. As a result, the step coverage is improved, and thus the rate of poor products and the generation of noise are reduced. Consequently, the overall performance of contact type image sensors is decreased.

THIRD EMBODIMENT

FIG. 9 illustrates the formation of the source and drain electrodes of thin film transistor 19 as shown in FIG. 5.

On a glass substrate 34, a lower amorphous silicon layer 35 and an upper high concentration amorphous silicon layer 36 are in turn coated, so as to form a channel layer. A photoresist 37 is coated on the upper amorphous silicon layer 36. Thereafter, a photo process is performed for removing unnecessary part of the photoresist 37. The photoresist 37 is then subject to a baking at the temperature of about 115° C. to about 150° C. and for about 10 minutes to about 40 minutes so that the material of photoresist 37 flows down, as shown in FIG. 8B.

Figure 9A:
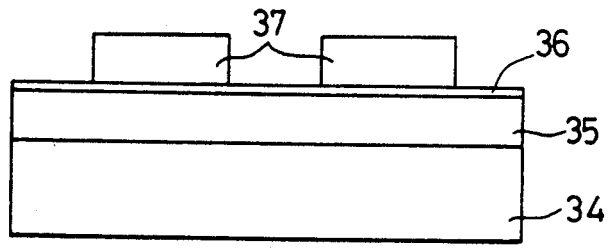
FIGS. 9A to 9D are schematic sectional views illustrating the formation of source and drain electrodes of the thin film transistor in accordance with the present invention.
Figure 9B:
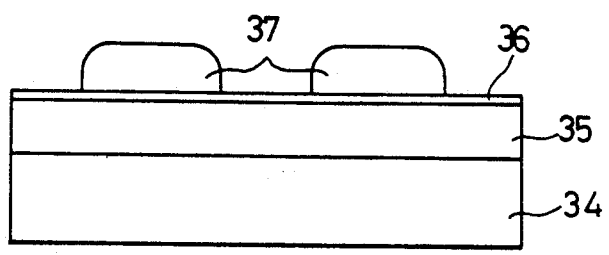
Figure 9C:
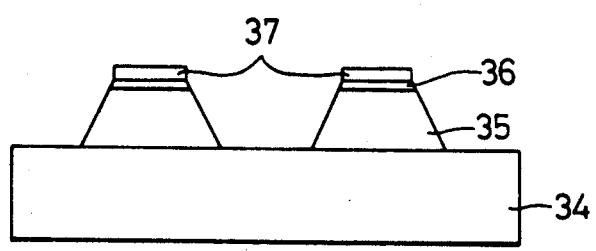

Subsequently, the photoresist 37 is subject to an ashing process, under the condition of using etching gases of $CF_4$ or $CCl_2F_2$ containing oxygen gas of about 4 SCCM to about 10 SCCM, as shown in FIG. 9C. Simultaneously, lower and upper amorphous silicon layers 35 and 36 are etched. At this time, the photoresist 37 is rapidly ashing processed at its edges, since the edges of photoresist 37 has been formed roundly by the heat treatment. As a result, the amorphous silicon layers 35 and 36 such that their opposite edges have a slope of about 15° to about 20°.

Figure 9D:
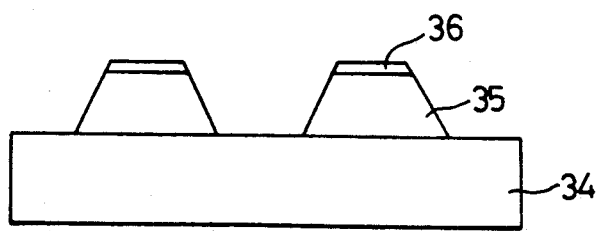

As shown in FIG. 9D, the photoresist 37 is then removed for sloping etching the amorphous layers 35 and 36 as the channel layer. Thereafter, the source electrode 17a and the drain electrode 17b are formed on the amorphous layers 35 and 36, respectively. At this time, they are formed to have a smooth slope, by virtue of respective opposite slant side edges of the amorphous silicon layer 35 and the n+ amorphous silicon layer 36.

As apparent from the above description, source and drain electrodes 17a and 17b are formed to have smoothly slant opposite side edges, in accordance with this embodiment of the present invention. Accordingly, the step coverage is improved, thereby avoiding the electrodes from being peeled off at their edges. In addition, the contact between the electrodes and the channel layer is improved.

FOURTH EMBODIMENT

A process for forming the contact zone in manufacturing semi-conductor elements will now be described, in conjunction with FIG. 16.

Figure 10A:
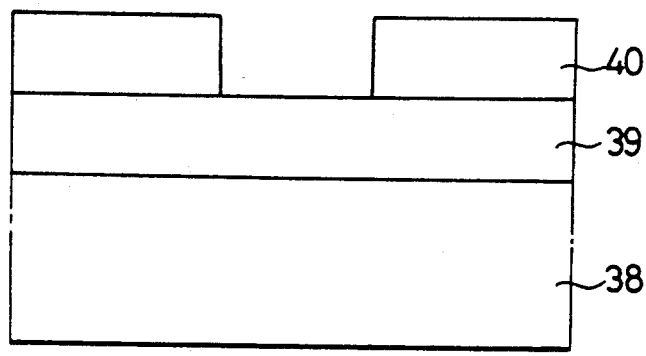
FIGS. 10A to 10E are schematic sectional views illustrating the formation of a contact zone of a semiconductor element in accordance with the present invention.
Figure 10B:
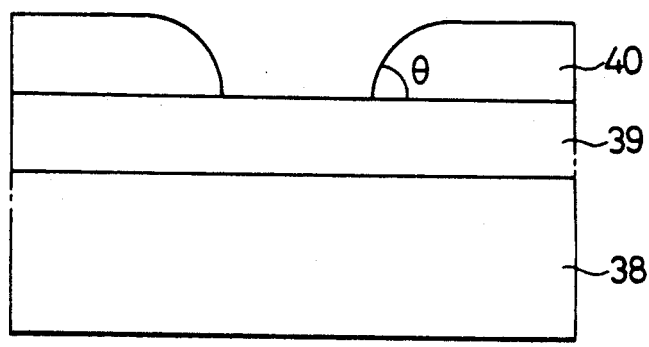
Figure 10C:
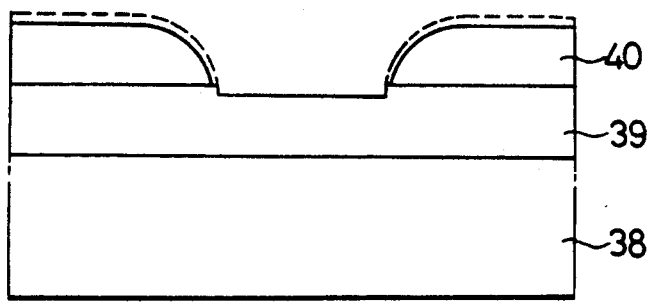
Figure 10D:
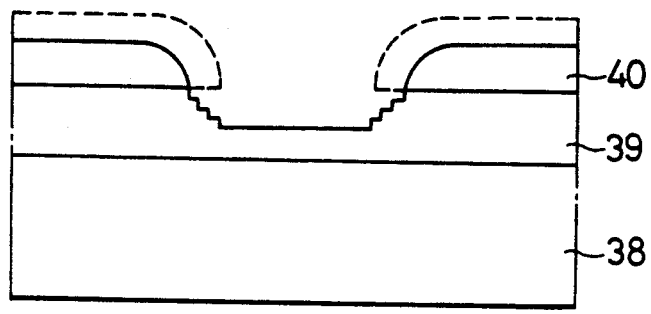
Figure 10E:
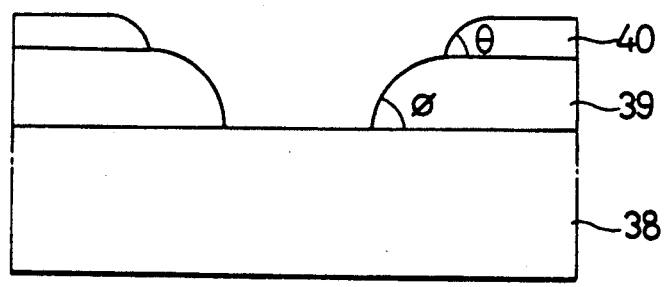

First, an oxide layer 39 is formed on a substrate 38, as shown in FIG. 10A. In order to define the contact zone, a photoresist 40 is coated on the oxide layer 39. Thereafter, the photoresist 40 is subject to a hard baking at the temperature determined to obtain a desired slope angle Θ, so that it flows slopingly down to have the desired slope angle Θ. Etch selectivity rate of the photoresist 40 and the oxide layer 39 is then determined, as shown in FIGS. 10C and 10D. Subsequently, the oxide layer 39 is contact etched to have a desired slope, by a dry etching.

The slope angle Θ of the photoresist 40 is determined depending on the hard baking temperature, while the slope angle φ of the oxide layer 39 in dry etching thereof is determined depending on the etch selectivity rate.

As apparent from the above description, the present invention provides the following effects:

First, eliminating the problems such as an over-etch and a particle contamination which have been conventionally encountered in wet etching, by virtue of the control of contact slope angle according to the baking temperature and the etch selectivity rate; and Second, improving the adhesion of the photoresist 40 to the oxide layer, by virtue of the hard baking.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A slope etching process comprising the steps of:
   (a) coating a photoresist on a layer of hard material;
   (b) defining said hard material layer by treating said photoresist according to a photo lithography process;
   (c) baking the photoresist under a predetermined condition so that it flows down to have at its opposite side edges respective slant surface of a desired slope angle and thereby provide the hard material layer at its opposite side edges with a desired slope angle; and (d) then dry etching simultaneously the photoresist and the hard material layer under a predetermined atmosphere.

2. A slope etching process in accordance with claim 1, further comprising the step of determining the etch selectivity rate of said hard material layer and said photoresist according to the desired slope angle of side edges of the hard material layer, after the step (c), but before the step (d).

3. A slope etching process in accordance with claim 1, further comprising the step of: soft baking said photoresist at a relatively low temperature and for a short time, after the step (a), but before the step (b), so as to remove a residue solvent on the photoresist.

4. A slope etching process in accordance with claim 1, wherein the step (c) comprises the steps of soft baking said photoresist at a relatively low temperature and for a short time, so as to remove a residue solvent on the photoresist and hard baking the photoresist at a relatively high temperature and for a long time, so as to provide the photoresist at its opposite side edges with a desired slope angle.

* * * * *